(12) United States Patent
Yen et al.

(10) Patent No.: US 9,929,106 B2
(45) Date of Patent: Mar. 27, 2018

(54) DISPLAY DEVICE AND ACTIVE ELEMENT SUBSTRATE

(71) Applicant: InnoLux Corporation, Miao-Li County (TW)

(72) Inventors: Chung-Wen Yen, Miao-Li County (TW); Chao-Hsiang Wang, Miao-Li County (TW); Jui-Jen Yueh, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/628,415

(22) Filed: Jun. 20, 2017

(65) Prior Publication Data

US 2017/0373014 A1    Dec. 28, 2017

(30) Foreign Application Priority Data

Jun. 22, 2016  (CN) .......................... 2016 1 0458534

(51) Int. Cl.
| H01L 27/12 | (2006.01) |
| H01L 23/544 | (2006.01) |
| H01L 21/8234 | (2006.01) |
| H01L 21/768 | (2006.01) |
| H01L 27/32 | (2006.01) |

(52) U.S. Cl.
CPC ...... *H01L 23/544* (2013.01); *H01L 21/76804* (2013.01); *H01L 21/823475* (2013.01); *H01L 27/124* (2013.01); *H01L 27/3258* (2013.01)

(58) Field of Classification Search
CPC ....... H01L 21/70; H01L 21/702; H01L 21/71; H01L 21/8232
See application file for complete search history.

(56) References Cited

U.S. PATENT DOCUMENTS

| 8,885,129 B2 | 11/2014 | Naoe et al. |
| 9,244,313 B2 | 1/2016 | Lee |
| 9,245,910 B2 | 1/2016 | Fukumoto et al. |
| 2016/0011475 A1 | 1/2016 | Takeuchi et al. |

*Primary Examiner* — Cheung Lee
(74) *Attorney, Agent, or Firm* — McClure, Qualey & Rodack, LLP

(57) ABSTRACT

A display device is provided. The display device includes a first substrate, a second substrate, a display layer, an active element layer, and a planar layer disposed on the active element layer. The planar layer includes a first contact hole. The display device further includes an electrode pad disposed on the planar layer. The display device further includes a passivation layer disposed on the electrode pad and the planar layer. The passivation layer includes a second contact hole. The first contact hole partially overlaps the second contact hole. The second contact hole has a projection on the planar layer and on the active element layer located at the bottom of the first contact hole, and the greatest width of the projection is at a first axis. The width of the electrode pad perpendicular to the first axis has a specific width change.

20 Claims, 6 Drawing Sheets

DISPLAY DEVICE AND ACTIVE ELEMENT SUBSTRATE

CROSS REFERENCE TO RELATED APPLICATIONS

This application claims priority of China Patent Application No. 201610458534.8, filed on Jun. 22, 2016, the entirety of which is incorporated by reference herein.

BACKGROUND

Technical Field

The disclosure relates to a display device and an active element substrate, and in particular to a display device and an active element substrate with a contact hole.

Description of the Related Art

Display devices are becoming more widely used in various products. Various display devices with wide-angles and high aperture ratios have been developed. However, existing display devices have not been satisfactory in every respect.
Therefore, a display device which has higher structural stability or which may improve the manufacturing yield is needed.

SUMMARY

The present disclosure provides a display device. The display device includes a first substrate, a second substrate, a display layer, an active element layer, a planar layer, an electrode pad, and a passivation layer. The display layer is disposed between the first substrate and the second substrate. The active element layer is disposed on the first substrate. The planar layer is disposed on the active element layer and includes a first contact hole. The electrode pad is disposed on the planar layer and at least partially overlaps the first contact hole. The passivation layer is disposed on the electrode pad and the planar layer. The passivation layer includes a second contact hole. The first contact hole at least partially overlaps the second contact hole. The second contact hole has a projection on the planar layer and on the active element layer located at the bottom of the first contact hole, a line segment between a first point of the projection and a second point of the projection has a maximum width, the first point is located inside the first contact hole, the second point is located outside the first contact hole, and the line segment is along a first axis. The widths of the electrode pad measured through a direction perpendicular to the first axis at an first point and a first measure point of the first axis have a relationship represented by Formula 1:

$$\frac{Wp1 - Wp0}{|X1|} < 0. \qquad \text{Formula 1}$$

An edge of the projection of the second contact hole at the bottom of the first contact hole intersects the first axis at the origin. The absolute value of X1 is the distance between the first point and the first measure point. The first measure point is located at the bottom of the first contact hole. Wp0 is the width of the electrode pad at the first point, and Wp1 is the width of the electrode pad at the first measure point.

The present disclosure also provides an active element substrate. The active element substrate includes a substrate, an active element layer disposed on the substrate, a planar layer disposed on the active element layer and including a first contact hole, an electrode pad disposed on the planar layer and at least partially overlapping the first contact hole, and a passivation layer disposed on the electrode pad and the planar layer. The passivation layer includes a second contact hole. The first contact hole at least partially overlaps the second contact hole. The second contact hole has a projection on the planar layer and on the active element layer located at the bottom of the first contact hole, a line segment between a first point of the projection and a second point of the projection has a maximum width, the first point is located inside the first contact hole, the second point is located outside the first contact hole, and the line segment is along a first axis. The widths of the electrode pad measured through a direction perpendicular to the first axis at an first point and a first measure point of the first axis have a relationship represented by Formula 1:

$$\frac{Wp1 - Wp0}{|X1|} < 0. \qquad \text{Formula 1}$$

An edge of the projection of the second contact hole at the bottom of the first contact hole intersects the first axis at the first point. The absolute value of X1 is the distance between the first point and the first measure point. The first measure point is located at the bottom of the first contact hole. Wp0 is the width of the electrode pad at the first point, and Wp1 is the width of the electrode pad at the first measure point.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
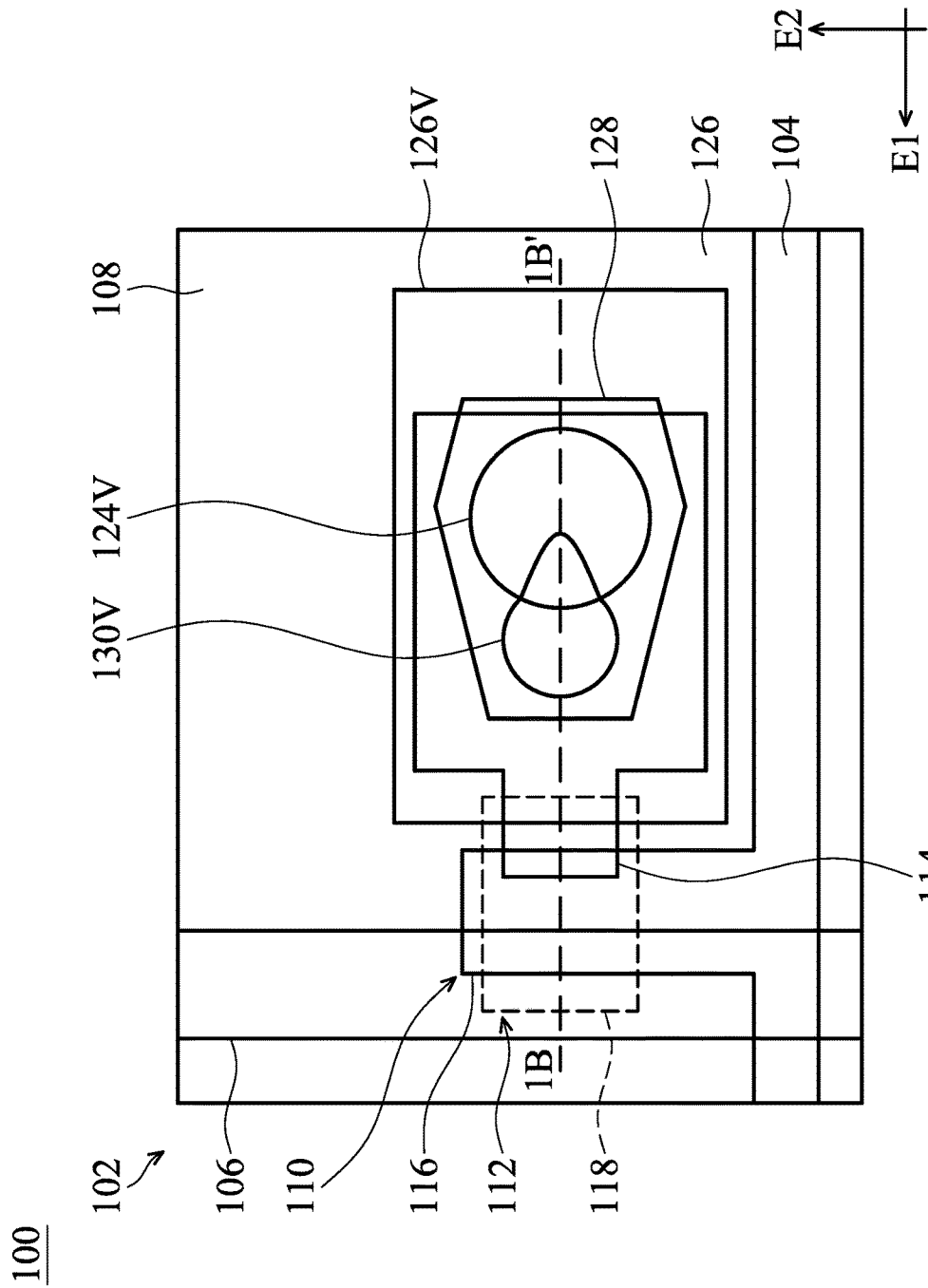
FIG. 1A is a top view of a first substrate of a display device in accordance with some embodiments of the present disclosure.

The display device of the present disclosure is described in detail in the following description. In the following detailed description, for purposes of explanation, numerous specific details and embodiments are set forth in order to provide a thorough understanding of the present disclosure.

The specific elements and configurations described in the following detailed description are set forth in order to clearly describe the present disclosure. It will be apparent, however, that the exemplary embodiments set forth herein are used merely for the purpose of illustration, and the concept of the present disclosure may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate directly contact of the first material layer and the second material layer, or it may indicate a non-contact state with one or more intermediate layers between the first material layer and the second material layer. In the above situation, the first material layer may not be indirectly contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The term "about" typically means +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer, portion or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All transistor element needed may be already formed on the substrate. However, the substrate is represented with a flat surface in order to simplify the drawing. The term "substrate surface" is meant to include the uppermost exposed layers on a transparent substrate, such as an insulating layer and/or metallurgy lines.

Some embodiments of the present disclosure utilize an electrode pad which at least partially covers a first contact hole of a planar layer. The electrode pad has a specific width change, which in turn improves the structural stability and the manufacturing yield of the display device.

First, referring to FIG. 1A, FIG. 1A is a top view of a first substrate 102 (through a direction perpendicular to the substrate) of the display device 100 in accordance with some embodiments of the present disclosure. As shown in FIG. 1A, the first substrate 102 may include a scan line (gate line) 104, which extends along a first direction E1, and the first direction E1 is parallel to the first substrate 102 (the first direction E1 and a normal vector of the first substrate 102 are orthogonal to each other in a local region). The first substrate 102 may further include a data line 106, which extends along a second direction E2 and intersects with the scan line 104. The second direction E2 is parallel to the first substrate 102 (the second direction E2 and a normal vector of the first substrate 102 are orthogonal in a local region, and the first direction is different from the second direction). In some embodiments, the first direction E1 and the direction E2 is substantially perpendicular or orthogonal to each other. In other embodiments, the first direction E1 and the direction E2 is not perpendicular or orthogonal to each other. In addition, the first substrate 102 may further include thin-film transistors 110 and sub-pixels 108, and at least one of the thin film transistors is corresponding to one of the sub-pixels 108. Thin-film transistor elements (active elements) are arranged in an array. The first substrate 102 is also referred to as an active element substrate.

The scan line (gate line) 104 provide the scan pulse signal to the transistors 110, and the data line 106 may provide the source signal to the sub-pixels 108 through the transistors 110 in coordination with the scan pulse signal.

Figure 1B:
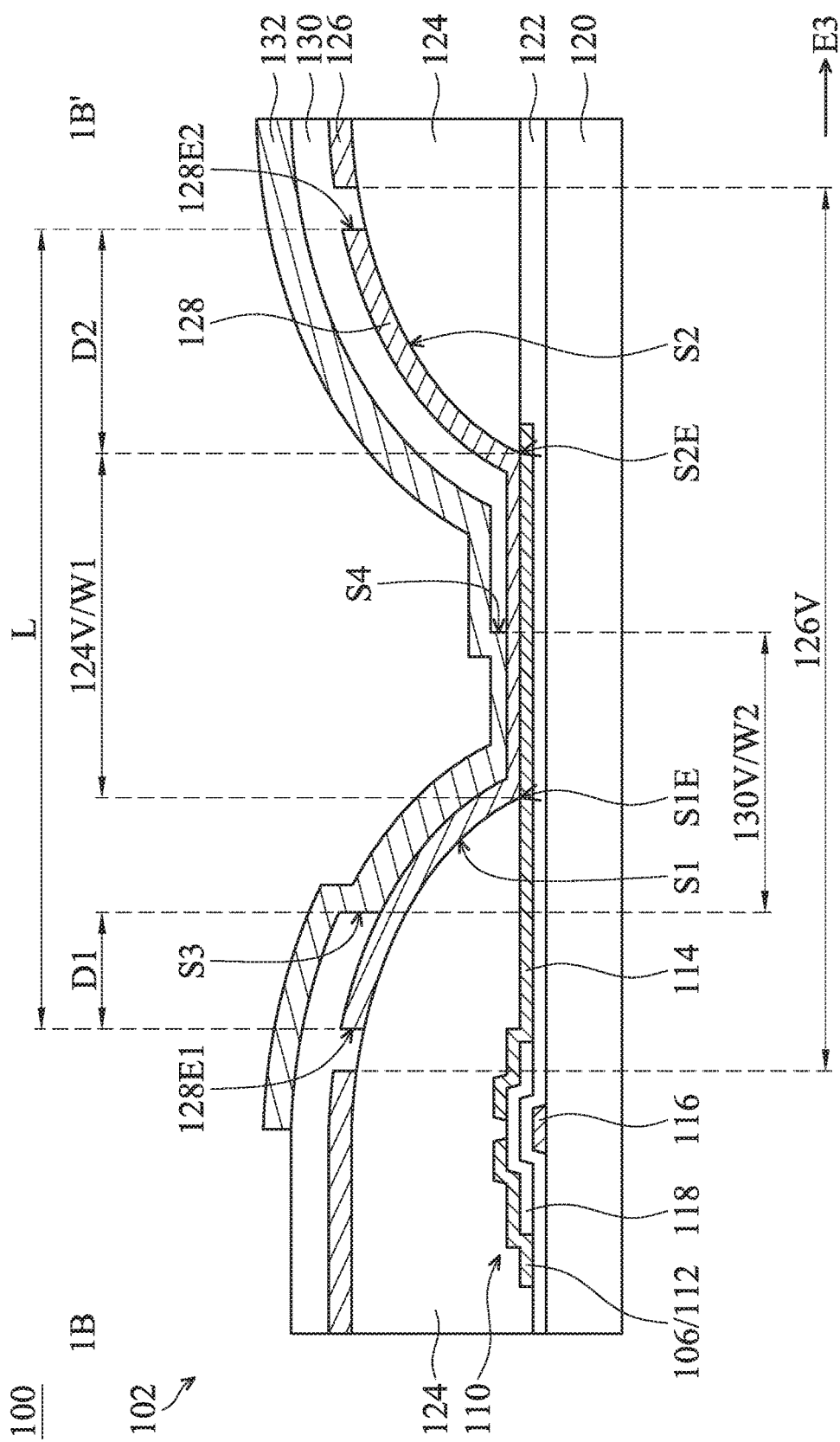
FIG. 1B is a cross-sectional view of a first substrate of a display device in accordance with some embodiments of the present disclosure.

The thin-film transistor 110 may include a source electrode 112, a drain electrode 114, a gate electrode 116, and a semiconductor layer 118. The semiconductor layer 118 overlaps with the source electrode 112, the drain electrode 114 and gate electrode 116. At least one insulating layer disposed between the gate electrode 116 and the semiconductor layer 118. The source electrode 112 and the drain electrode 114 connect to the semiconductor layer 118. The gate electrode 116 extends outwards from the gate line 104 substantially along the second direction E2. The source electrode 112 is a portion of the data line 106. The thin-film transistor 110 is formed by stacking a plurality of insulating layers and/or non-insulating layers, which may also by referred to as an active element layer. Afterwards, referring to FIG. 1B, FIG. 1B is a cross-sectional view of the first substrate 102 of the display device 100 in accordance with some embodiments of the present disclosure. FIG. 1B is a cross-sectional view along line 1B-1B' in FIG. 1A in accordance with some embodiments of the present disclosure. As shown in FIG. 1B, the first substrate 102 may include a substrate 120. The substrate 120 may include, but is not limited to, a transparent substrate, such as a glass substrate, a ceramic substrate, a plastic substrate, or any other suitable substrate. The thin-film transistor 110 may include the gate electrode 116, the gate dielectric layer 122, semiconductor layer 118, source electrode 112 and the drain electrode 114 disposed on the substrate 120.

The material of the gate electrode 116 may include, but is not limited to, conductive amorphous silicon, conductive poly-silicon, one or more metal, conductive metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The gate electrode 116 may be formed by the chemical vapor deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.-650° C. The thickness of the amorphous silicon conductive material layer or poly-silicon conductive material layer may range from about 1000 Å to 10000 Å.

The material of the gate dielectric layer 122 may include, but is not limited to, silicon oxide, silicon nitride, silicon oxynitride, high-k material, any other suitable dielectric material, or a combination thereof. The high-k material may include, but is not limited to, insulating metal oxide, insulating metal nitride, insulating metal silicide, insulating transition metal oxide, insulating transition metal nitride, insulating transition metal silicide, insulating transition metal oxynitride, insulating metal aluminate, zirconium silicate, insulating zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof. The gate dielectric layer 122 may be formed by chemical vapor deposition or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

The thin film transistors 110 further includes a semiconductor layer 118 disposed on the gate dielectric layer 122. The semiconductor layer 118 overlaps the gate electrode 116. The source electrode 112 and drain electrode 114 are disposed at opposite sides of the semiconductor layer 118, respectively. The source electrode 112 and drain electrode 114 overlap with the portions of the semiconductor layer 118 at the opposite sides, respectively.

The semiconductor layer 118 may include an element semiconductor which may include semi-conductive amorphous silicon, semi-conductive polycrystalline silicon, germanium; a compound semiconductor which may include indium gallium zinc oxide (IGZO), indium gallium zinc tin oxide (IGZTO), gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy; or a combination thereof.

The source electrode 112 (or data line 106) and drain electrode 114 may include, but is not limited to, copper, aluminum, molybdenum, tungsten, gold, cobalt, nickel, platinum, titanium, iridium, rhodium, an alloy thereof, a combination thereof, or any other conductive material. For example, the source electrode 112 and drain electrode 114 may include a three-layered structure such as Mo/Al/Mo or Ti/Al/Ti. In other embodiments, the source electrode 112 and drain electrode 114 includes a nonmetal material. The source electrode 112 and drain electrode 114 may include any conductive material. The material of the source electrode 112 and drain electrode 114 may be formed by chemical vapor deposition (CVD), sputtering, resistive thermal evaporation, electron beam evaporation, or any other suitable method. In some embodiments, the materials of the source electrode 112 and drain electrode 114 may be the same, and the source electrode 112 and drain electrode 114 may be formed by the same deposition steps. However, in other embodiments, the source electrode 112 and drain electrode 114 may be formed by different deposition steps, and the materials of the source electrode 112 and drain electrode 114 may be different from each other.

In addition, although in the structure in the embodiment shown in FIG. 1B, the gate electrode is disposed under the semiconductor layer (bottom gate structure), the embodiments of the present disclosure may also be applied to a structure having a gate electrode is disposed on the semiconductor layer (top gate structure).

Still referring to FIG. 1B, the substrate 102 further includes a planar layer 124 disposed on the drain electrode 114. The planar layer 124 also covers the thin-film transistor 110 and the gate dielectric layer 122. The material of the planar layer 124 may include, but is not limited to, organic insulating materials (such as photosensitive resins) or inorganic insulating materials (such as silicon nitride, silicon oxide, silicon oxynitride, silicon carbide, aluminum oxide, or a combination thereof).

Still referring to FIGS. 1A-1B, the planar layer 124 includes the first contact hole 124V. The first contact hole 124V exposes a portion of the drain electrode 114. In addition, still referring to FIG. 1B, in cross-section view, the planar layer 124 includes a first sidewall S1 and a second sidewall S2 which are part of the first contact hole 124V.

Still referring to FIG. 1B, the first substrate 102 further includes a first electrode 126 disposed on the planar layer 124 and an electrode pad 128 which is disposed on the planar layer 124 and at least partially covers the first contact hole 124V. In some embodiments of the present disclosure, the first electrode 126 is a common electrode 126.

The common electrode 126 is formed on the surface of the planar layer 124 (or on the substrate 120). The common electrode 126 has an opening 126V. The opening 126V exposes the first contact hole 124V and the subsequent second contact hole.

In addition, as shown in FIGS. 1A-1B, the electrode pad 128 is disposed within the opening 126V. The electrode pad 128 is spaced apart from the common electrode 126, wherein an interval is between the electrode pad 128 and the common electrode 126. The electrode pad 128 is electrically isolated from the common electrode 126. In addition, in some embodiments of the present disclosure, the electrode pad 128 is conformally disposed on the first sidewall S1 and the second sidewall S2 of the first contact hole 124V. In some embodiments of the present disclosure, the electrode pad 128 is indirectly contact with the first sidewall S1 and the second sidewall S2 of the first contact hole 124V.

In addition, in some embodiments of the present disclosure, the electrode pad 128 is electrically connected to the drain electrode 114. The electrode pad 128 is directly contact with the drain electrode 114. In addition, in some embodiments of the present disclosure, the electrode pad 128 completely covers the first contact hole 124V. In some embodiments, the electrode pad 128 may cover part of the first contact hole 124V.

In some embodiments of the present disclosure, the material of the common electrode 126 and electrode pad 128 may independently include, but are not limited to, a transparent conductive material such as indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxide material. The material of the common electrode 126 and electrode pad 128 may be formed by chemical vapor deposition (CVD), sputtering, resistive thermal evaporation, electron beam evaporation, or any other suitable method. In some embodiments, the materials of the common electrode 126 and electrode pad 128 may be the same, and the common electrode 126 and electrode pad 128 may be formed by the same deposition steps. However, in other embodiments, the common electrode 126 and electrode pad 128 may be formed by different deposition steps, and the materials of the common electrode 126 and electrode pad 128 may be different from each other.

Still referring to FIG. 1B, the first substrate 102 further includes a passivation layer 130 disposed on the common electrode 126, the electrode pad 128 and the planar layer 124. The material of the passivation layer 130 may include, but is not limited to, silicon nitride, silicon oxide, or silicon oxynitride. The passivation layer 130 may be formed by chemical vapor deposition or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

The passivation layer 130 includes the second contact hole 130V, and the second contact hole 130V exposes a portion of the electrode pad 128, as shown in FIG. 1B. In addition, in some embodiments of the present disclosure, the first contact hole 124V partially overlaps the second contact hole 130V as shown in FIG. 1A.

Still referring to FIG. 1B, in cross-section view, the passivation layer 130 includes a third sidewall S3 and a fourth sidewall S4 which define the second contact hole 130V. The third sidewall S3 is located on the first sidewall 51, and the fourth sidewall S4 is located in the first contact hole 124V.

Still referring to FIG. 1B, the first substrate 102 further includes a second electrode 132 disposed on the passivation layer 130 and the electrode pad 128. In some embodiments of the present disclosure, the second electrode 132 may be a pixel electrode 132. In addition, the pixel electrode 132 may be electrically connected to the electrode pad 128 and the drain electrode 114. In addition, in some embodiments of the present disclosure, the pixel electrode 132 is directly contact with the electrode pad 128.

In some embodiments of the present disclosure, the material of the pixel electrode 132 may independently include, but are not limited to, a transparent conductive material such as indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxide material. The material of the pixel electrode 132 may be formed by chemical vapor deposition (CVD), sputtering, resistive thermal evaporation, electron beam evaporation, or any other suitable method.

It should be noted that, the pixel electrode 132 is not shown in FIG. 1A in order to clearly describe the present disclosure.

Figure 2A:
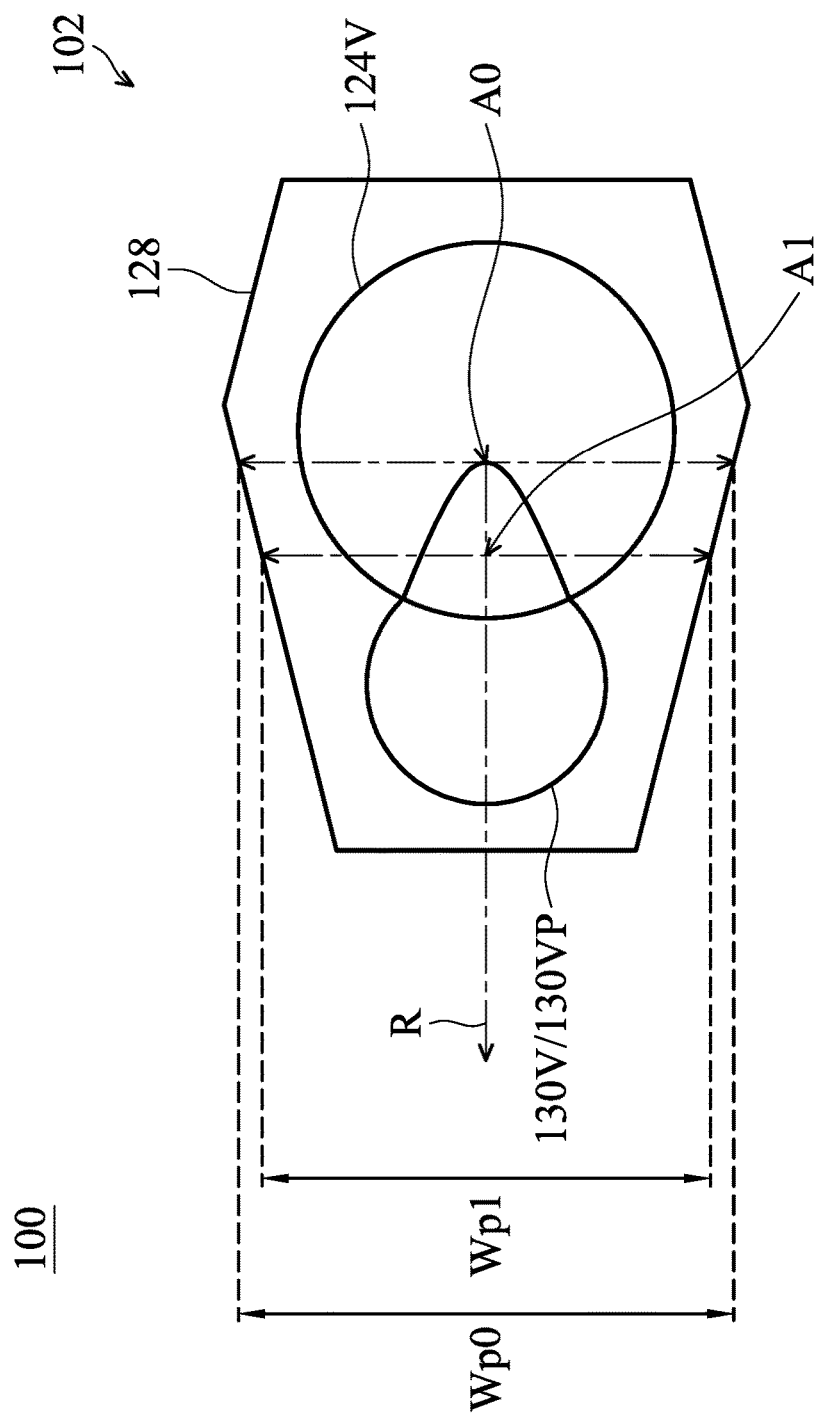
FIG. 2A is a top view of a first substrate of a display device in accordance with some embodiments of the present disclosure.

Afterwards, referring to FIG. 2A, FIG. 2A is a top view of the first substrate 102 of the display device 100 in accordance with some embodiments of the present disclosure. In addition, it should be noted that FIG. 2A only shows the first contact hole 124V, the second contact hole 130V and the electrode pad 128 in order to clearly describe the present disclosure.

As shown in FIG. 2A, in some embodiments of the present disclosure, the width of the electrode pad 128 changes as the widths of the first contact hole 124V or the second contact hole 130V change. Specifically, as shown in FIG. 2A, when viewed from a top view, the second contact hole 130V has a projection 130VP. The projection 130VP could be projected on an interface of the planar layer 124 and the active element layer located at a bottom of the first contact hole 124V. The maximum width of the projection 130VP is a line segment along a first axis R. It should be noted that, the projection 130VP of the second contact hole 130V is observed by a scanning electron microscope (SEM). In addition, the projection 130VP is not limited to the projection directly on the interface of the planar layer 124 and the active element layer, the projection 130VP could be projected on a surface of the substrate 120.

Still referring to FIG. 2A, the edge of the projection 130VP of the second contact hole 130V at the bottom of the first contact hole 124V intersects the first axis R at the origin A0 (first point) of the line segment along the first axis R. The line segment has a first measure point A1 in the first contact hole 124V. The width Wp0 is the width of the electrode pad 128 perpendicular to the first axis R at the origin A0, and The width Wp1 is the width of the electrode pad 128 perpendicular to the first axis R at the first measure point A1.

In addition, the origin A0 is located at the position X0 on the line segment along the first axis R, and the first measure point A1 is located at the position X1 on the line segment along first axis R. Therefore, the distance between the origin A0 and the first measure point A1 is the absolute value of the value derived by subtracting X0 from X1.

In some embodiments of the present disclosure, since X0 is the origin A0, the distance between the origin A0 and the first measure point A1 is the absolute value of X1.

In addition, as shown in FIG. 2A, the width of the first contact hole 124V perpendicular to the first axis R is greater than the width of the second contact hole 130V perpendicular to the first axis R. In addition, the width of the electrode pad 128 perpendicular to the first axis R changes as the width of the first contact hole 124V perpendicular to the first axis R and the width of the second contact hole 130V perpendicular to the first axis R change. In other words, at the origin A0 and the first measure point A1 of the first axis R, the widths of the electrode pad 128 perpendicular to the first axis R have a relationship represented by Formula A:

$$\frac{Wp1 - Wp0}{X1 - X0} < 0.$$

In addition, since the origin A0 is located at the position X0 on the first axis R, X0 is 0 in the coordinate system. The absolute value of the value derived by subtracting X0 from X1 is X1. In other words, the absolute value of X1 is the distance between the first measure point A1 and the origin A0 on the first axis R. In these embodiments, the distance X1 is a positive value, and the distance X0 is 0. In these embodiments, at the origin A0 and the first measure point A1 of the first axis R, the widths of the electrode pad 128 perpendicular to the first axis R have a relationship represented by Formula 1:

$$\frac{Wp1 - Wp0}{|X1|} < 0.$$

In some embodiments of the present disclosure, since the width of the electrode pad 128 perpendicular to the first axis R changes as the width of the first contact hole 124V perpendicular to the first axis R and the width of the second contact hole 130V perpendicular to the first axis R change, the electrode pad 128 in some embodiments of the present disclosure may cover the first contact hole 124V and the second contact hole 130V effectively. Therefore, the peeling-off issue of the planar layer 124 adjacent to the first contact hole 124V and the second contact hole 130V in the manufacturing process may be reduced or prevented. For example, in the manufacturing process which removes the photoresist disposed on the planar layer 124, the peeling-off issue of the planar layer 124 adjacent to the first contact hole 124V and the second contact hole 130V may be reduced or prevented. Therefore, the structural stability and the manufacturing yield of the display device 100 may be improved.

In addition, in some embodiments of the present disclosure, the electrode pad 128 completely covers the projection 130VP of the second contact hole 130V on the interface of the planar layer 124 and the active element layer located at a bottom of the first contact hole 124V, as shown in FIG. 2A. In addition, in some embodiments of the present disclosure, the electrode pad 128 may completely cover the first contact hole 124V. Thereby, the structural stability and the manufacturing yield of the display device 100 may be improved further. However, it should be noted that, in some other embodiments, the electrode pad 128 may partially cover the first contact hole 124V.

Figure 2B:
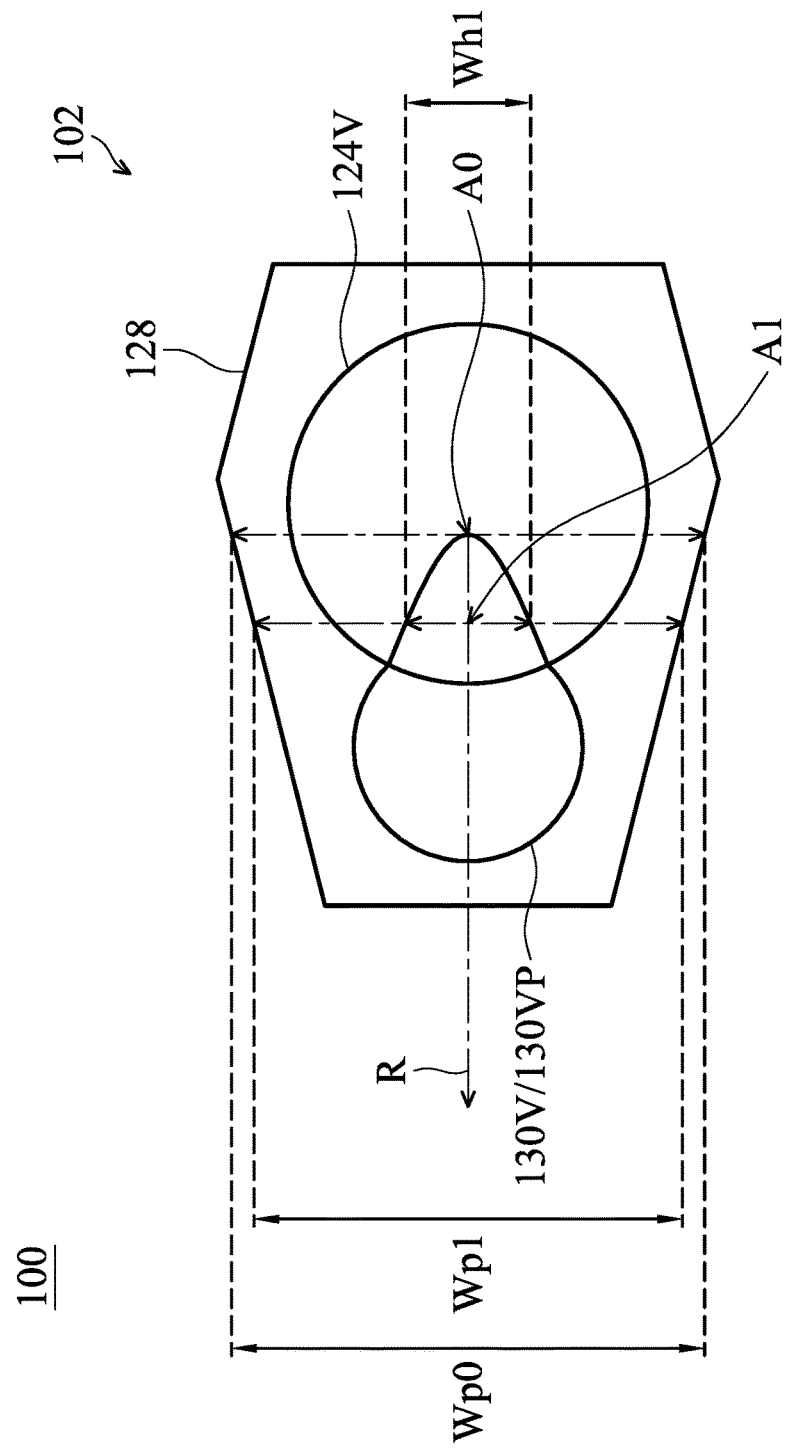
FIG. 2B is a top view of a first substrate of a display device in accordance with some embodiments of the present disclosure.

Afterwards, referring to FIG. 2B, FIG. 2B is a top view of the first substrate 102 of the display device 100 in accordance with some embodiments of the present disclosure. In addition, it should be noted that FIG. 2B only shows the first contact hole 124V, the second contact hole 130V and the electrode pad 128 in order to clearly describe the present disclosure.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

As shown in FIG. 2B, in some embodiments of the present disclosure, the changing rate of the width of the second contact hole 130V in the first contact hole 124V is greater than the changing rate of the width of the electrode pad 128 at the corresponding position.

Specifically, Wh1 is the width of the projection 130VP of the second contact hole 130V perpendicular to the first axis R at the first measure point A1. The width of the projection 130VP of the second contact hole 130V perpendicular to the first axis R at the origin A0 is 0. Therefore, the change of the width of the second contact hole 130V perpendicular to the first axis R from the first measure point A1 to the origin A0 is the width difference derived by subtracting 0 from width Wh1. In other words, the change of the width of the second contact hole 130V perpendicular to the first axis R in the first contact hole 124V from the first measure point A1 to the origin A0 is the width difference derived by subtracting 0 from the width Wh1.

In addition, as shown in FIG. 2B, the change of the width of the electrode pad 128 perpendicular to the first axis R from the first measure point A1 to the origin A0 is the absolute value of the value derived by subtracting the width Wp0 from the width Wp1.

In these embodiments, as shown in FIG. 2B, at the origin A0 and the first measure point A1 of the first axis R, the width of the electrode pad 128 perpendicular to the first axis R and the width of the projection 130VP of the second contact hole 130V perpendicular to the first axis R have a relationship represented by Formula B:

$$\frac{Wh1 - 0}{X1 - X0} > \left|\frac{Wp1 - Wp0}{X1 - X0}\right|.$$

In addition, since the origin A0 is located at the position X0 on the first axis R, X0 is 0 in the coordinate system. The absolute value of the value derived by subtracting X0 from X1 is X1. In other words, the absolute value of X1 is the distance between the first measure point A1 and the origin A0 on the first axis R. In these embodiments, the distance X1 is a positive value, and the distance X0 is 0. In these embodiments, at the origin A0 and the first measure point A1 of the first axis R, the width of the electrode pad 128 perpendicular to the first axis R and the width of the projection 130VP of the second contact hole 130V perpendicular to the first axis R have a relationship represented by Formula 2:

$$\frac{Wh1}{|X1|} > \frac{|Wp1 - Wp0|}{|X1|}.$$

In some embodiments of the present disclosure, the changing rate of the width of the second contact hole 130V in the first contact hole 124V is greater than the changing rate of the width of the electrode pad 128 at the corresponding position.

Figure 2C:
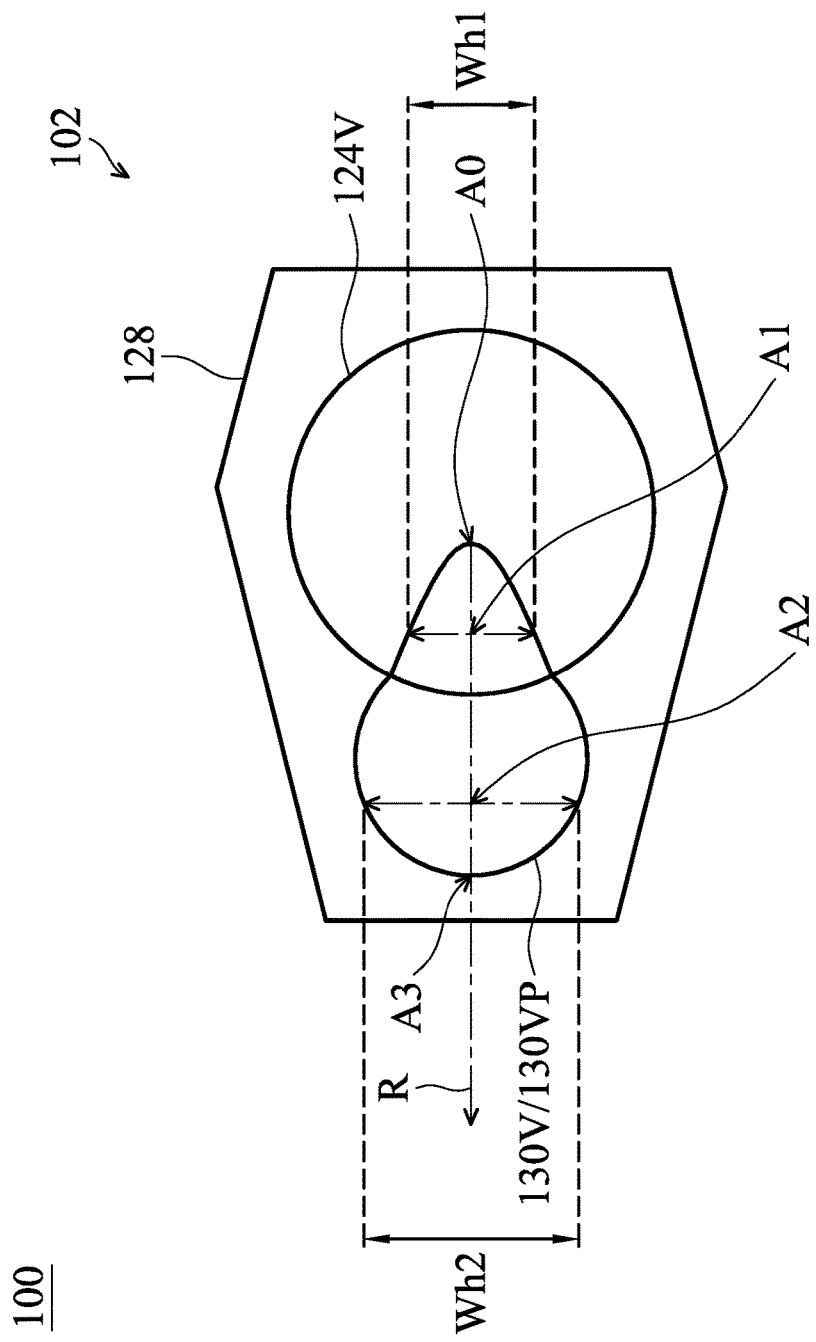
FIG. 2C is a top view of a first substrate of a display device in accordance with some embodiments of the present disclosure.

Afterwards, referring to FIG. 2C, FIG. 2C is a top view of the first substrate 102 of the display device 100 in accordance with some embodiments of the present disclosure. In addition, it should be noted that FIG. 2C only shows the first contact hole 124V, the second contact hole 130V and the electrode pad 128 in order to clearly describe the present disclosure.

As shown in FIG. 2C, in some embodiments of the present disclosure, the changing rate of the width of the second contact hole 130V on the planar layer 124 is greater than the changing rate of the width of the second contact hole 130V in the first contact hole 124V. In addition, in some embodiments of the present disclosure, the portion of the second contact hole 130V on the planar layer 124 is the portion of the second contact hole 130V which is not located in the first contact hole 124V in FIG. 2C.

Still referring to FIG. 2C, the edge of the projection 130VP of the second contact hole 130V at the bottom of the first contact hole 124V intersects the line segment along the first axis R at the origin A0 (first point). The first axis R has a first measure point A1 in the first contact hole 124V. The line segment along the first axis R has a second measure point A2 on the planar layer 124. The second measure point A2 is located outside the first contact hole 124V and inside the second contact hole 130V. The edge of the projection 130VP of the second contact hole 130V on the planar layer 124 intersects the first axis R at an end-most point A3 (second point). Two terminals of the line segment along the first axis R are the origin A0 (first point) and the end-most point A3 (second point).

In addition, in some embodiments of the present disclosure, the first measure point A1 and the second measure point A2 is positioned between the first measure point A1 and the second measure point A2.

In addition, in some embodiments of the present disclosure, the distance between the origin A0 and the first measure point A1 is equal to the distance between the second measure point A2 and the end-most point A3.

The width of the projection 130VP of the second contact hole 130V perpendicular to the first axis R at the origin A0 is 0. Wh1 is the width of the projection 130VP of the second contact hole 130V perpendicular to the first axis R at the first measure point A1. Wh2 is the width of the projection 130VP of the second contact hole 130V perpendicular to the first axis R at the second measure point A2. The width of the projection 130VP of the second contact hole 130V perpendicular to the first axis R at the end-most point A3 is 0.

In addition, the origin A0 is located at the position X0 on the first axis R, and the first measure point A1 is located at the position X1 on the first axis R. Therefore, the distance between the origin A0 and the first measure point A1 is the absolute value of the value derived by subtract X0 from X1.

In addition, the end-most point A3 is located at the position X3 on the first axis R, and the second measure point A2 is located at the position X2 on the first axis R. Therefore, the distance between the end-most point A3 and the second measure point A2 is the absolute value of the value derived by subtracting X2 from X3.

In addition, the width of the projection 130VP of the second contact hole 130V perpendicular to the first axis R at the origin A0 is 0, and the width of the projection 130VP of the second contact hole 130V perpendicular to the first axis R at the first measure point A1 is the width Wh1. Therefore, the change of the width of the second contact hole 130V perpendicular to the first axis R from the first measure point A1 to the origin A0 is the width difference derived by subtracting 0 from the width Wh1. In other words, the change of the width of the second contact hole 130V in the first contact hole 124V from the first measure point A1 to the origin A0 is the width difference derived by subtracting 0 from the width Wh1.

In addition, the width of the projection 130VP of the second contact hole 130V perpendicular to the first axis R at the second measure point A2 is the width Wh2, and the width of the projection 130VP of the second contact hole 130V perpendicular to the first axis R at the end-most point A3 is 0. Therefore, the change of the width of the second contact hole 130V perpendicular to the first axis R from the end-most point A3 to the second measure point A2 is the absolute value of the value derived by subtracting the width Wh2 from 0. In other words, the change of the width of the second contact hole 130V on the planar layer 124 from the end-most point A3 to the second measure point A2 is the absolute value of the value derived by subtracting the width Wh2 from 0.

Still referring to FIG. 2C, at the first measure point A1 and the second measure point A2 of the first axis R, the widths of the projection 130VP of the second contact hole 130V perpendicular to the first axis R on an interface of the planar layer 124 and the active element located at the bottom of the first contact hole 124V have a relationship represented by Formula C:

$$\left|\frac{0-Wh2}{X3-X2}\right| > \frac{Wh1-0}{X1-X0}.$$

In addition, since the distance between the origin A0 and the first measure point A1 is equal to the distance between the second measure point A2 and the end-most point A3, the absolute value of the value derived by subtracting the width X2 from X3 is equal to the absolute value of the value derived by subtracting the width X0 from X1.

In addition, in some embodiments of the present disclosure, since the origin A0 is located at the position X0 on the first axis R, X0 is 0 in the coordinate system. The absolute value of the value derived by subtracting X0 from X1 is X1. In other words, the absolute value of X1 is the distance between the first measure point A1 and the origin A0 on the first axis R. In these embodiments, the distance X1 is a positive value, and the distance X0 is 0.

In addition, in some embodiments of the present disclosure, the end-most point A3 is located at the position X3 on the first axis R in the coordinate system, and the second measure point A2 is located at the position X2 on the first axis R in the coordinate system. In other words, the distance between the end-most point A3 and the second measure point A2 is the absolute value of the value derived by subtracting X2 from X3. In some embodiments of the present disclosure, X3 and X2 are both positive value, and X3 is greater than X2.

In these embodiments, the widths of the projection 130VP of the second contact hole 130V perpendicular to the first axis R on an interface of the planar layer 124 and the active element located at the bottom of the first contact hole 124V have a relationship represented by Formula 3:

$$\frac{Wh2}{|X3-X2|} > \frac{Wh1}{|X1|}.$$

In addition, since the distance between the second measure point A2 and the end-most point A3 on the first axis R is equal to the distance between the origin A0 and the first measure point A1 on the first axis R, the absolute value of the value derived by subtracting the width X2 from X3 is equal to the absolute value of X1.

In some embodiments of the present disclosure, the changing rate of the width of the second contact hole 130V perpendicular to the first axis R in the first contact hole 124V is smaller than the changing rate of the width of the second contact hole 130V perpendicular to the first axis R on the planar layer 124.

Afterwards, in some embodiments of the present disclosure, referring to FIG. 1B, the electrode pad 128 has a length L along a direction E3. In addition, the distance W1 is a distance between the bottom of the first sidewall S1 and the bottom of the second sidewall S2 along the direction E3, the distance W2 is a distance between the third sidewall S3 and the fourth sidewall S4 along the direction E3. The distance D1 is a distance between the edge 128E1 of the electrode pad 128 and the third sidewall S3 along the direction E3, and the distance D2 is a distance between another edge 128E2 of the electrode pad 128 and the bottom of the second sidewall S2 along the direction E3.

In some embodiments of the present disclosure, the length L satisfies Formula 4

$$W1 < L - D1 - D2 < W1 + W2.$$

In addition, in some embodiments of the present disclosure, the direction E3 is parallel to the first axis R. Alternatively, in some embodiments of the present disclosure, the direction E3 overlaps the first axis R.

In addition, as shown in FIG. 1B, the first sidewall S1 and the second sidewall S2 are two opposite sidewalls of the first contact hole 124V of the planar layer 124 along the direction E3. The third sidewall S3 and the fourth sidewall S4 are two opposite sidewalls of the second contact hole 130V of the passivation layer 130 along the direction E3.

In addition, in some embodiments of the present disclosure, as shown in FIG. 1B, the distance D1 is a distance between the edge 128E1 of the electrode pad 128 which is closer to the third sidewall S3 and the third sidewall S3 along the direction E3. The distance D2 is a distance between the edge 128E2 of the electrode pad 128 which is closer to the second sidewall S2 and an end point S2E of the bottom of the second sidewall S2 along the direction E3. The distance W1 is a distance between the end point S1E of the bottom of the first sidewall S1 and the end point S2E of the bottom of the second sidewall S2 along the direction E3.

In addition, in some embodiments of the present disclosure, as shown in FIG. 1B, the distance between the edge 128E1 of the electrode pad 128 which is closer to the third sidewall S3 and the bottom of the first sidewall S1 along the direction E3 is greater than the distance between the edge 128E2 of the electrode pad 128 which is closer to the second sidewall S2 and the bottom of the second sidewall S2 along the direction E3.

Figure 3:
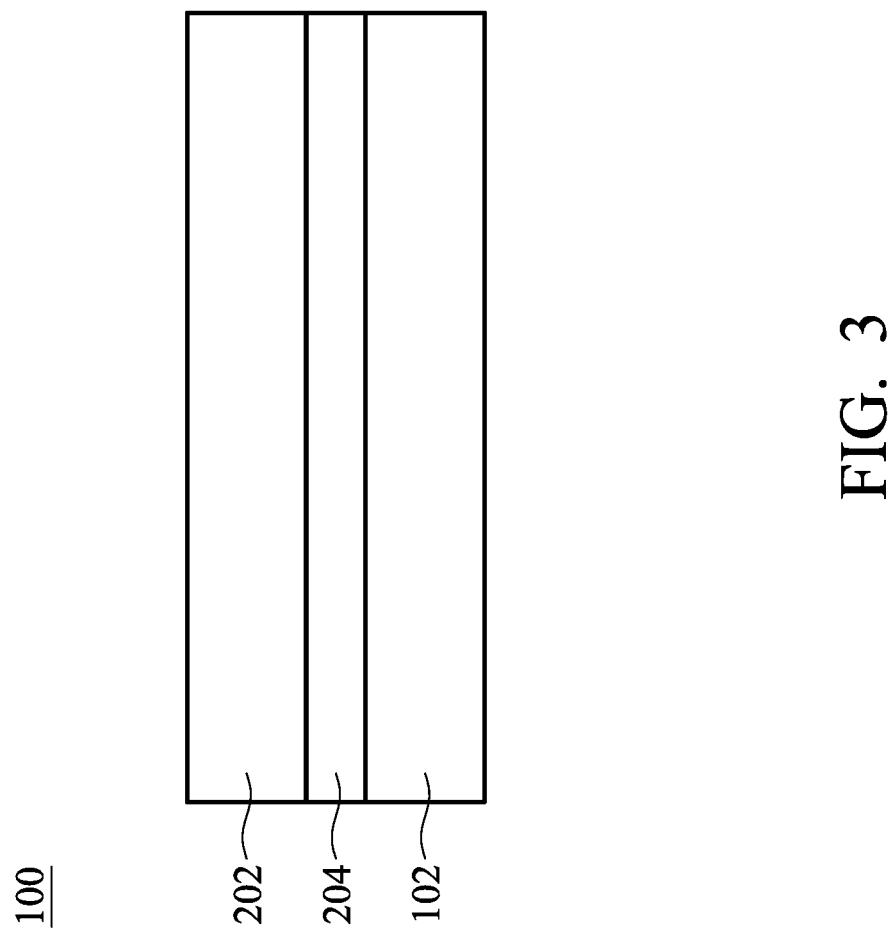
FIG. 3 is a cross-sectional view of a display device in accordance with some embodiments of the present disclosure.

Afterwards, referring to FIG. 3, FIG. 3 is a cross-sectional view of a display device 100 in accordance with some embodiments of the present disclosure. As shown in FIG. 3, the display device 100 in FIG. 3 includes the first substrate 102 of the present disclosure, an second substrate 202 disposed opposite to the first substrate 102 and a display layer 204 disposed between the first substrate 102 and the second substrate 202.

The second substrate 202 may be a color filter substrate, a transparent substrate, or any other suitable substrate. The color filter substrate may include a transparent substrate and a color filter layer disposed on the transparent substrate. The transparent substrate may include, but is not limited to, a glass substrate, a ceramic substrate, a plastic substrate, or any other suitable transparent substrate.

The display layer 204 may be a liquid-crystal material. The liquid-crystal material may include, but is not limited to, nematic liquid crystal, smectic liquid crystal, cholesteric liquid crystal, blue phase liquid crystal, or any other suitable liquid-crystal material. In other embodiments, the display layer 204 may be a plurality of inorganic light emitting diodes with micrometer size (micro-LED), a plurality of organic light emitting diodes (OLED), or a plurality of quantum dot light emitting diodes (QLED).

The display device 100 may include, but is not limited to, a liquid-crystal display such as a thin film transistor liquid-crystal display. Alternatively, the liquid-crystal display may include, but is not limited to, a twisted nematic (TN) liquid-crystal display, a super twisted nematic (STN) liquid-crystal display, a double layer super twisted nematic (DSTN) liquid-crystal display, a vertical alignment (VA) liquid-crystal display, an in-plane switching (IPS) liquid-crystal display, a cholesteric liquid-crystal display, a blue phase liquid-crystal display, or any other suitable liquid-crystal display. In other embodiments, the display device 100 may include a micro-LED display device, an OLED display device, or a QLED display device.

In summary, in some embodiments of the present disclosure, since the width of the electrode pad perpendicular to the first axis R changes as the width of the first contact hole perpendicular to the first axis R and the width of the second contact hole perpendicular to the first axis R change, the electrode pad in some embodiments of the present disclosure may cover the first contact hole and the second contact hole effectively. Therefore, the peeling-off issue of the planar layer adjacent to the first contact hole and the second contact hole in the manufacturing process may be reduced or prevented. Therefore, the structural stability and the manufacturing yield of the display device 100 may be improved.

In addition, in some embodiments of the present disclosure, the changing rate of the width of the second contact hole in the first contact hole is greater than the changing rate of the width of the electrode pad at the corresponding position.

In addition, in some embodiments of the present disclosure, the changing rate of the width of the second contact hole perpendicular to the first axis R in the first contact hole is smaller than the changing rate of the width of the second contact hole perpendicular to the first axis R on the planar layer.

In addition, it should be noted that the drain and source mentioned above in the present disclosure are switchable since the definition of the drain and source is related to the voltage connecting thereto.

Note that the above element sizes, element parameters, and element shapes are not limitations of the present disclosure. Those skilled in the art can adjust these settings or values according to different requirements. It should be understood that the display device of the present disclosure are not limited to the configurations of FIGS. 1A to 3. The present disclosure may merely include any one or more features of any one or more embodiments of FIGS. 1A to 3. In other words, not all of the features shown in the figures should be implemented in the display device of the present disclosure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

Although some embodiments of the present disclosure and their advantages have been described in detail, the present disclosure is not limited thereto. It should be understood that various changes, substitutions and alterations can be made herein without departing from the spirit and scope of the disclosure as defined by the appended claims. The scope of the present application is based on the claim of the present application. In addition, each appended claim is an independent embodiment, and every combination of the claims and embodiments are within the scope of the present application.

What is claimed is:

1. A display device, comprising:
   a substrate, comprising;
   a planar layer disposed on the substrate, and the planar layer comprising a first contact hole;
   an electrode pad disposed on the planar layer, wherein at least a portion of the electrode pad overlaps the first contact hole; and
   a passivation layer disposed on the electrode pad and the planar layer, wherein the passivation layer comprises a second contact hole, at least a portion of the second contact hole overlaps the first contact hole, the second contact hole has a projection in top view, a line segment between a first point of the projection and a second point of the projection has a maximum width, the first point is located inside the first contact hole, the second point is located outside the first contact hole, and the line segment is along a first axis; and
   a display layer disposed on the substrate,
   wherein a first measure point is located on the line segment and between the first point and the second point, the first measure point is located inside the first contact hole, a width of the electrode pad measured through a direction perpendicular to the first axis at the first point is defined as a first width Wp0, and a width of the electrode pad measured through the direction perpendicular to the first axis at the first measure point is defined as a second width Wp1, a third width X1 is defined as a width between the first point and the first measure point, and the first width Wp0, the second width Wp1, and the third width X1 are conformed to the following formula:

$$\frac{Wp1 - Wp0}{|X1|} < 0.$$

2. The display device as claimed in claim 1, wherein a width of the second contact hole measured through the direction perpendicular to the first axis at the first measure point is defined as a fourth width Wh1, and the first width Wp0, the second width Wp1, the third width X1, and the fourth width Wh1 are conformed to the following formula:

$$\frac{Wh1}{|X1|} > \frac{|Wp1 - Wp0|}{|X1|}.$$

3. The display device as claimed in claim 2, wherein a second measure point is located on the line segment and between the first point and the second point, the second measure point is located outside the first contact hole, a width of the second contact hole measured through the direction perpendicular to the first axis at the second measure point is defined as a fifth width Wh2, a width between the first point and the second measure point is defined as a sixth width X2, a width between the first point and the second point is defined as a seventh width X3, and the fourth width Wh1, the fifth width Wh2, the third width X1, the sixth width X2, and the seventh width X3 are conformed to the following formula:

$$\frac{Wh2}{|X3 - X2|} > \frac{Wh1}{|X1|}.$$

4. The display device as claimed in claim 1, wherein the planar layer comprises a first sidewall and a second sidewall which are part of the first contact hole, wherein the passivation layer comprises a third sidewall and a fourth sidewall which are part of the second contact hole, wherein the third sidewall is located on the first sidewall, and the fourth sidewall is located in the first contact hole,
   wherein a distance between the first sidewall and the second sidewall and measured along a direction parallel to the substrate is defined as a first distance W1, a distance between the third sidewall and the fourth sidewall and measured along the direction parallel to the substrate is defined as a second distance W2, the electrode pad has a third distance L measured along the direction parallel to the substrate, a distance between an edge of the electrode pad and the third sidewall measured along the direction parallel to the substrate is defined as a fourth distance D1, and a distance between another edge of the electrode pad and the second sidewall measured along the direction parallel to the substrate is defined as a fifth distance D2,
   wherein the first distance W1, the second distance W2, the third distance L, the fourth distance D1, and the fifth distance D2 are conformed to the following formula:

$$W1 < L - D1 - D2 < W1 + W2.$$

5. The display device as claimed in claim 4, wherein the first sidewall and the second sidewall are two opposite sidewalls of the first contact hole of the planar layer along the direction.

6. The display device as claimed in claim 4, wherein the third sidewall and the fourth sidewall are two opposite sidewalls of the second contact hole of the passivation layer along the direction.

7. The display device as claimed in claim 4, wherein the direction is parallel to the first axis.

8. The display device as claimed in claim 4, wherein the fourth distance D1 is a distance between the edge of the electrode pad close to the third sidewall and the third sidewall along the direction.

9. The display device as claimed in claim 4, wherein the fifth distance D2 is a distance between the edge of the electrode pad closer to the second sidewall and an end point of the bottom of the second sidewall along the direction.

10. The display device as claimed in claim 4, wherein a distance between the edge of the electrode pad close to the third sidewall and the bottom of the first sidewall along the direction is greater than a distance between the edge of the electrode pad close to the second sidewall and the bottom of the second sidewall along the direction.

11. An active element substrate, comprising:
a planar layer disposed on the substrate, and the planar layer comprising a first contact hole;
an electrode pad disposed on the planar layer, wherein at least a portion of the electrode pad overlaps the first contact hole; and
a passivation layer disposed on the electrode pad and the planar layer, wherein the passivation layer comprises a second contact hole, at least a portion of the second contact hole overlaps the first contact hole, the second contact hole has a projection in top view, a line segment between a first point of the projection and a second point of the projection has a maximum width, the first point is located inside the first contact hole, the second point is located outside the first contact hole, and the line segment is along a first axis; and
a display layer disposed on the substrate,
wherein a first measure point is located on the line segment and between the first point and the second point, the first measure point is located inside the first contact hole, a width of the electrode pad measured through a direction perpendicular to the first axis at the first point is defined as a first width Wp0, and a width of the electrode pad measured through the direction perpendicular to the first axis at the first measure point is defined as a second width Wp1, a third width X1 is defined as a width between the first point and the first measure point, and the first width Wp0, the second width Wp1, and the third width X1 are conformed to the following formula:

$$\frac{Wp1 - Wp0}{|X1|} < 0.$$

12. The active element substrate as claimed in claim 11, wherein a width of the second contact hole measured through the direction perpendicular to the first axis at the first measure point is defined as a fourth width Wh1, and the first width Wp0, the second width Wp1, the third width X1, and the fourth width Wh1 are conformed to the following formula:

$$\frac{Wh1}{|X1|} > \frac{|Wp1 - Wp0|}{|X1|}.$$

13. The active element substrate as claimed in claim 12, wherein a second measure point is located on the line segment and between the first point and the second point, the second measure point is located outside the first contact hole, a width of the second contact hole measured through the direction perpendicular to the first axis at the second measure point is defined as a fifth width Wh2, a width between the first point and the second measure point is defined as a sixth width X2, a width between the first point and the second point is defined as a seventh width X3, and the fourth width Wh1, the fifth width Wh2, the third width X1, the sixth width X2, and the seventh width X3 are conformed to the following formula:

$$\frac{Wh2}{|X3 - X2|} > \frac{Wh1}{|X1|}.$$

14. The active element substrate as claimed in claim 11, wherein the planar layer comprises a first sidewall and a second sidewall which are part of the first contact hole, wherein the passivation layer comprises a third sidewall and a fourth sidewall which are part of the second contact hole, wherein the third sidewall is located on the first sidewall, and the fourth sidewall is located in the first contact hole,
wherein a distance between the first sidewall and the second sidewall and measured along a direction parallel to the substrate is defined as a first distance W1, a distance between the third sidewall and the fourth sidewall and measured along the direction parallel to the substrate is defined as a second distance W2, the electrode pad has a third distance L measured along the direction parallel to the substrate, a distance between an edge of the electrode pad and the third sidewall measured along the direction parallel to the substrate is defined as a fourth distance D1, and a distance between another edge of the electrode pad and the second sidewall measured along the direction parallel to the substrate is defined as a fifth distance D2,
wherein the first distance W1, the second distance W2, the third distance L, the fourth distance D1, and the fifth distance D2 are conformed to the following formula:

$$W1 < L - D1 - D2 < W1 + W2.$$

15. The active element substrate as claimed in claim 14, wherein the first sidewall and the second sidewall are two opposite sidewalls of the first contact hole of the planar layer along the direction.

16. The active element substrate as claimed in claim 14, wherein the third sidewall and the fourth sidewall are two opposite sidewalls of the second contact hole of the passivation layer along the direction.

17. The active element substrate as claimed in claim 14, wherein the direction is parallel to the first axis.

18. The active element substrate as claimed in claim 14, wherein the fourth distance D1 is a distance between the edge of the electrode pad close to the third sidewall and the third sidewall along the direction.

19. The active element substrate as claimed in claim 14, wherein the fifth distance D2 is a distance between the edge of the electrode pad closer to the second sidewall and an end point of the bottom of the second sidewall along the direction.

20. The active element substrate as claimed in claim 14, wherein a distance between the edge of the electrode pad close to the third sidewall and the bottom of the first sidewall along the direction is greater than a distance between the edge of the electrode pad close to the second sidewall and the bottom of the second sidewall along the direction.

* * * * *